United States Patent [19]

Arnold, III et al.

[11] Patent Number: 4,820,611
[45] Date of Patent: Apr. 11, 1989

[54] TITANIUM NITRIDE AS AN ANTIREFLECTION COATING ON HIGHLY REFLECTIVE LAYERS FOR PHOTOLITHOGRAPHY

[75] Inventors: William H. Arnold, III, Cupertino; Mohammad Farnaam, Santa Clara; Jack Sliwa, Los Altos Hills, all of Calif.

[73] Assignee: Advanced Micro Devices, Inc., Sunnyvale, Calif.

[21] Appl. No.: 42,402

[22] Filed: Apr. 24, 1987

[51] Int. Cl.⁴ .................................................. G03C 1/94
[52] U.S. Cl. ..................................... 430/271; 430/275; 430/276; 430/311; 430/313; 430/316; 430/317; 430/318; 430/523; 430/524; 430/525; 430/950; 437/229
[58] Field of Search ............... 430/313, 314, 316, 317, 430/318, 329, 275, 278, 311, 271, 276, 523, 524, 525, 950; 437/229

[56] References Cited

U.S. PATENT DOCUMENTS 4,587,138  5/1986  Yam et al. ............................. 427/88

FOREIGN PATENT DOCUMENTS 61-242039  10/1986  Japan .

OTHER PUBLICATIONS

Harrison et al., "The Use of Anti-Reflection Coatings . . .", National Semiconductor Corporation, 1983.
Van den Berg, "Antireflective Coatings on Metal Layers for Photolithographic Purposes", Journal of Applied Physics, vol. 50, No. 3, pp. 1212–1214 (Mar. 1979).
Brewer, "The Reduction of the Standing Wave Effect in Positive Photoresists", Journal of Applied Photographic Engineering, vol. 7, No. 6, pp. 184–186 (Dec. 1981).
Martin, "Optical Properties of $TiN_x$ Produced by Reactive Evaporation and Reactive Ion-Beam Sputtering", Vacuum, vol. 32, pp. 359–362 (1982).

Primary Examiner—José G. Dees
Attorney, Agent, or Firm—Ashen Golant Martin & Sheldon

[57] ABSTRACT

Reflection of incident optical radiation (18) from a highly reflective metal layer (12), such as aluminum or titanium, into a photoresist layer (14) is reduced by interposing a layer of titanium nitride (16) between the metal and photoresist layers. The thickness of the TiN layer depends on the wavelength of the optical radiation used to expose the photoresist and on the optical properties of the underlying metal layer. Reflectance of less than about 2% may be achieved using the TiN layer in conjunction with aluminum and less than about 5% in conjunction with titanium, in accordance with the invention. If left in place after patterning an underlying aluminum layer, the TiN layer also serves to suppress hillock formation in the aluminum layer.

10 Claims, 2 Drawing Sheets

TITANIUM NITRIDE AS AN ANTIREFLECTION COATING ON HIGHLY REFLECTIVE LAYERS FOR PHOTOLITHOGRAPHY

BACKGROUND OF THE INVENTION

1. Field of the Invention

The present invention relates to photolithographic techniques in semiconductor processing, and, more particularly, to high resolution optical lithography using the g-, h-, or i-lines of the mercury spectrum for exposure of photolithographic films on a highly reflective surface, such as aluminum or titanium.

2. Description of the Related Art

In the construction of integrated circuit devices, one or more metallic layers, such as aluminum or titanium, are deposited and subsequently patterned to provide ohmic or Schottky contacts and electrical connections between various circuit elements. Conventionally, photoresist is spun over the metallic layer and then exposed to a light pattern and developed. The normally aluminum metallic layer is then selectively plasma-etched with chlorine-containing gases through the openings in the resist layer. The remaining photoresist is then removed, leaving the final metal pattern.

Antireflective coatings have been used over reflective surfaces such as aluminum or titanium to improve resist patterning control by reducing interference effects and diffuse scattering, particularly if the illumination is monochromatic. Such effects have become less and less tolerable as linewidth and pitch have been reduced in newer integrated circuit designs of greater density.

One approach to reduce the reflected light has been to use metal or refractory materials as antireflective films on aluminum. Examples of such materials include titanium-tungsten (TiW) and molybdenum disilicide ($MoSi_2$). Van den Berg et al in "Antireflective Coatings on Metal Layers for Photolighographic Purposes", *Journal of Applied Physics*, Vol. 50, No. 3, pp. 1212–1214 (March 1979) proposed the use of amorphous silicon, amorphous selenium and chromium oxide as antireflective coatings. However, amorphous silicon reduces aluminum reflectance at a wavelength 436 nm to only about 15 to 20%, and its deposition characteristically intoduces numerous harmful particulates.

The use of organic coatings, such as a thin polyimide with a light absorbing dye, has been described by Brewer et al in "The Reduction of the Standing Wave Effect in Positive Photoresists", *Journal of Applied Photographic Engineering*, Vol. 7, No. 6, pp. 184–186 (December 1981). However, this technique requires a separate polyimide spin and cure. The curing technique has proved difficult to control properly on the production line because of the tight temperature tolerances required.

SUMMARY OF THE INVENTION

Accordingly, it is an object of the present invention to provide an improved process for production of integrated circuit structures wherein light reflection into a photoresist from a highly reflective surface is minimized during photolithographic exposure.

It is another object of the present invention to provide a process for reducing light reflection into a photoresist layer from an aluminum or titanium layer during photolithographic exposure.

It is a further object of the presnet invention to provide a process for reducing light reflection into a photoresist layer from a highly reflective layer to levels considerably below that provided by prior art antireflection coatings.

Briefly, in accordance with the invention, a highly reflective layer, such as aluminum or titanium, is coated with a layer of titanium nitride (TiN). A layer of photoresist is then formed over the TiN layer.

The TiN layer is formed to a thickness which will provide the minimum reflectance into the photoresist layer at a preselected wavelength of light, i.e., the optical radiation employed in the photolithographic exposure process. The TiN layer thicknesses for the wavelengths primarily used in photolithography to achieve minimum reflectance into the overlying resist layer are as follows:

| Wavelength | TiN Thickness Range | |
|---|---|---|
| | Aluminum | Titanium |
| 365 nm (i) | 300–400 Å | 150–250 Å |
| 405 nm (h) | 350–450 Å | 200–300 Å |
| 436 nm (g) | 400–500 Å | 250–350 Å. |

However, it will be appreciated that other wavelengths may be employed in the practice of the invention, and the determination of the optimum TiN thickness for such wavelengths is easily made. The calculation of the TiN thicknesses to give the minimum reflectance is based on the optical properties found in Martin et al, "Optical Properties of $TiN_x$ Produced by Reactive Evaporation and Reactive Ion-Beam Sputtering", *Vacuum*, Vol. 32, pp. 359–362 (1982).

Other objects, features and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

Figure 1A:
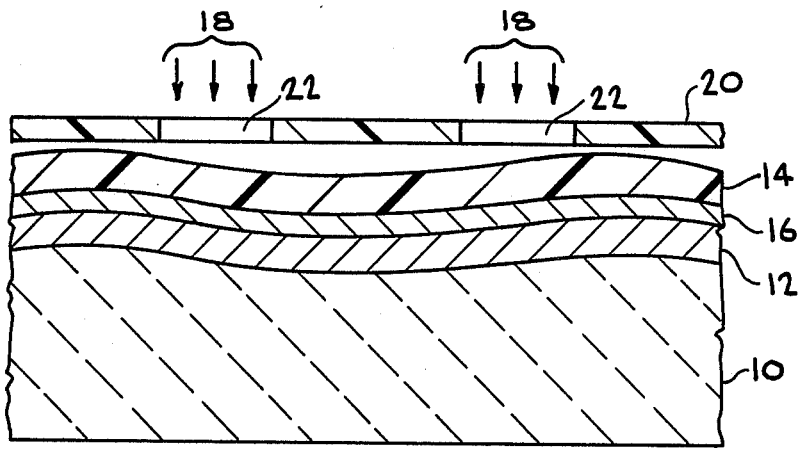
FIGS. 1a–c are a cross-sectional view of a portion of an integrated circuit structure illustrating the process of the invention.

FIG. 1a depicts a cross-sectional view of a portion of an integrated circuit structure, shown generally at 10, having a highly reflective metal layer 12 formed thereon. Metal layers particularly benefitted by the practice of the invention include aluminum and titanium, and accordingly, these layers are preferred.

The metal layer 12 is formed in accordance with conventional present practice, and thus does not form a part of this invention. While the metal layer 12 is described herein as preferably comprising aluminum or titanium, it will be appreciated that the teachings of the invention are applicable to layers of other reflective materials, such as tungsten and Ti on polysilicon, which are to be patterned using photolithographic processes. For such other materials, the TiN thickness to provide antireflection will be different. However, such determination is easily made, as discussed below.

While it is desired to form a photoresist layer 14 on the metal layer 12 as part of the patterning process, it has been shown above that reflective light from the surface of the metal layer interferes with high resolution optical lithography. Accordingly, an antireflective layer 16 is first formed on the surface of the metal layer 12. The photoresist layer 14 is then formed on the surface of the antireflective layer 16. The photoresist layer 14 is formed by conventional methods, such a spinning a solution of the photoresist in a solvent on the surface of the antireflective layer 16. The solvent is allowed to dry, leaving the photoresist layer 14.

In accordance with the invention, the antireflective layer 16 comprises titanium nitride (TiN). The thickness to which the TiN layer 16 is formed depends upon the wavelength employed in the photolithographic process and on the optical properties of the underlying metal layer 12, and will be discussed in greater detail below. The process of depositing the TiN layer 16 is again conventional; examples include sputtering or evaporating titanium from a titanium target in an argon/nitrogen ambient, chemical vapor deposition (CVD) from a suitable source, and sputtering, evaporation or CVD of titanium onot a substrate and annealing the coated substrate in nitrogen ambient.

The TiN layer 16 formed comprises essentially stoichoimetric TiN, although the nitrogen-to-titanium atomic ratio may vary about ±10%.

In FIG. 1a, light, represented by arrows 18, is incident on a mask 20, which is provided with apertures 22. The light, or optical radiation, 18 passes only through those apertures 22 to expose those portions of the resist layer 14 underlying the apertures, thereby patterning the resist. Such a process is conventional, and forms no part of this invention.

Figure 1B:
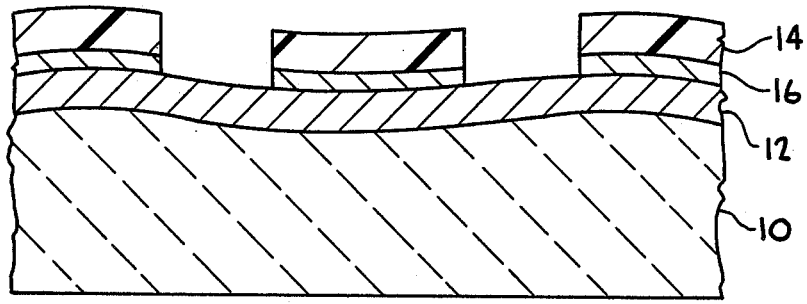

After resist exposure, the resist layer 14 is developed in a conventional solvent to remove those portions of the exposed resist. Next, those portions of the TiN layer 16 underlying the portions of exposed resist are etched, thereby uncovering portions of the metal layer 12. Such etching of TiN may be done by plasma etching in a fluorine-containing gas, for example. FIG. 1b depicts the cross-sectional view of the integrated circuit structure at this state in the processing.

Following the TiN etch, the uncovered portions of the underlying metal layer 12 are etched, such as by plasma etching in a chlorine-containing gas. The remaining portions of the resist layer 14 are then removed, such as by plasma stripping in an oxygen plasma. The resulting structure is shown in FIG. 1c.

Figure 1C:
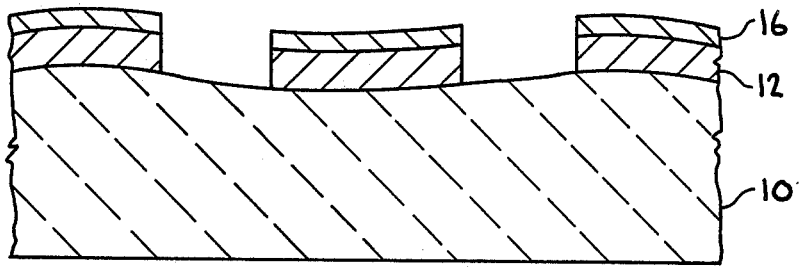

The TiN layer 16 may either be retained as a hillock suppression layer for a metal layer 12 of aluminum, as shown in FIG. 1c. As is known, if a layer of aluminum (pure or in the form of an alloy) is deposited on a silicon wafer at a temperature, and if subsequently the temperature of the wafer is raised substantially above the deposition temperature, then aluminum undergoes a compressive stress which results in migration of aluminum material from the aluminum/underlayer interface towards the surface of the aluminum layer, forming nodules sticking out of the surface at heights which can be as much as ten times the thickness of the aluminum layer. If there is already a layer of silicon dioxide or a refractory material on the surface of the aluminum, then the formation of these nodules, which are called "hillocks", is suppressed.

Alternatively, the TiN layer 16 may be removed, such as by stripping, using fluorine chemistry. As an example, a mixture of $O_2$ and $CHF_3$ in a reactive ion etcher may be used.

Use of the titanium nitride layer 16 in accordance with the invention minimizes standing wave interference in the resist layer 14 due to reflection, resist notching due to light scattering from the surface of the metal layer 12, and flare in the stepper optics due to light reflected back from the wafer. The TiN layer 16 also suppresses hillock formation in aluminum layers.

The reflectance into the resist layer 14 obtained using a TiN layer 16 can be less than about 5%, depending on the thickness chosen and the metal layer 12. Reflectances less than about 2% can be achieved with an aluminum layer 12.

Figure 2:
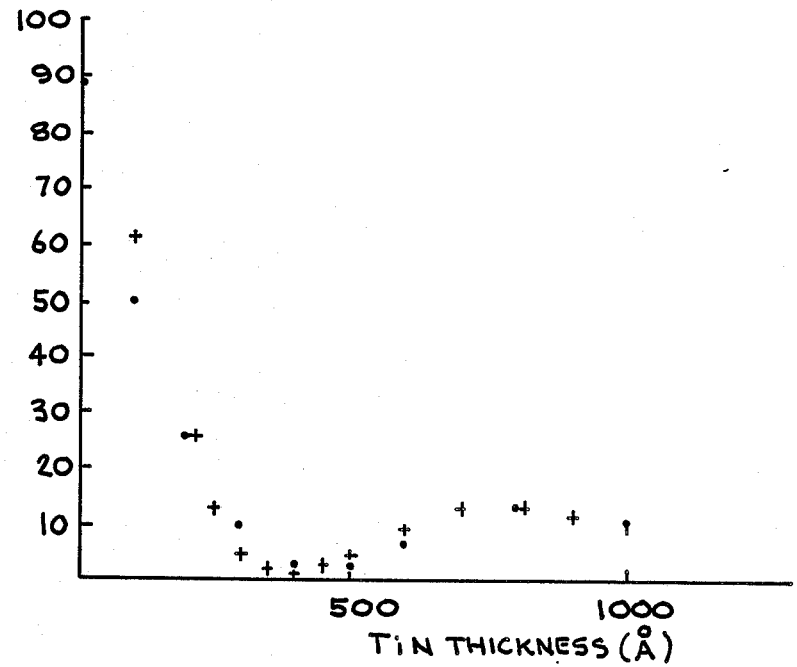
FIG. 2 is a plot of reflectance as a function of TiN thickness for an aluminum layer.
Figure 3:
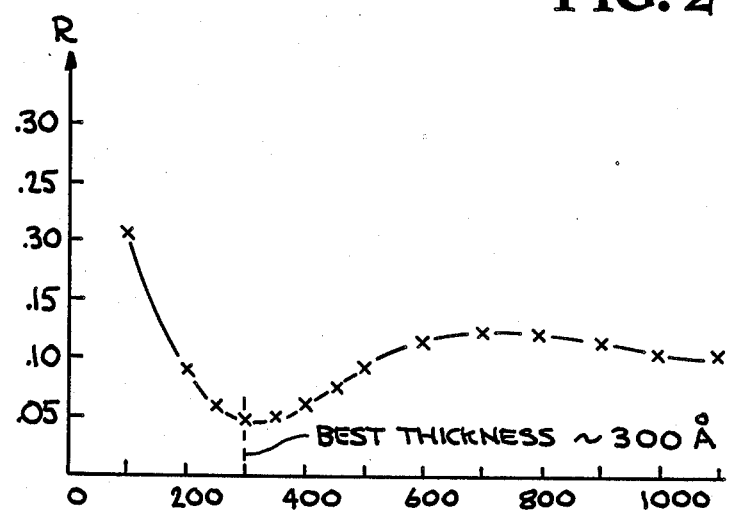
FIG. 3 is a plot of reflectance as a function of TiN thickness for a titanium layer.

The thickness of the TiN layer 16 is a function of the wavelength of theincident optical radiation 18, as shown in FIGS. 2 (for aluminum) and 3 (for titanium). For particular wavelengths of the mercury spectrum (g-, h-, and i-lines), the thickness range for TiN on aluminum and on titanium associated with a particular wavelength is as follows:

| Wavelength | TiN Thickness Range | |
| --- | --- | --- |
| | Aluminum | Titanium |
| 365 nm (i) | 300–400 Å | 150–250 Å |
| 405 nm (h) | 350–450 Å | 200–300 Å |
| 436 nm (g) | 400–500 Å | 250–350 Å. |

However, it will be appreciated that other wavelengths may be employed in the practice of the invention, and the determination of the optimum TiN thickness for such wavelengths is easily made by measuring reflectance as a function of thickness.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in the art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for reducing the amount of light (18) having a preselected wavelength reflected back from a highly reflective wafer surface (12) into a resist layer (14) formed thereover, said wafer surface comprising a metal selected from the group consisting of aluminum and titanium, said process comprising forming a layer (16) of titanium nitride between said wafer surface and said resist layer, said layer of titanium nitride formed to a thickness ranging from about 300 to 500 Å where said highly reflective wafer surface comprises aluminum and from about 150 to 350 Å where said highly reflective wafer surface comprises titanium, thereby reducing said amount of light reflected to less than about 5% of the incident radiation.

2. The process of claim 1 wherein said highly reflective surface of said wafer comprises aluminum and said thickness of said titanium nitride layer (16) has the following range associated with said wavelength of said light (18):

| Wavelength | TiN Thickness Range |
|---|---|
| 365 nm | 300–400 Å |
| 405 nm | 350–450 Å |
| 436 nm | 400–500 Å. |

3. The process of claim 1 wherein said highly reflective surface of said wafer comprises titanium and said thickness of said titanium nitride layer (16) has the following range associated with said wavelength of said light (18):

| Wavelength | TiN Thickness Range |
|---|---|
| 365 nm | 150–260 Å |
| 405 nm | 200–300 Å |
| 436 nm | 250–350 Å. |

4. A process for reducing the amount of light (18) having a preselected wavelength reflected back from a metal layer (12) selected from the group consisting of aluminum and titanium to less than about 5% of the incident wavelength intensity into a resist layer (14) formed thereover comprising forming a layer (16) of titanium nitride between said metal layer and said resist layer, said layer of titanium nitride formed to a thickness of ranging from about 300 to 500 Å where said metal layer comprises aluminum and from about 150 to 350 Å where said metal layer comprises titanium and which depends on said wavelength of said light.

5. A process for reducing the amount of light (18) having a preselected wavelength reflected back from a metal layer (12) comprising aluminum to less than about 5% of the incident wavelength intensity into a resist layer (14) formed thereover comprising forming a layer (16) of titanium nitride between said metal layer and said resist layer, said layer of titanium nitride formed to a thickness having the following range associated with said wavelength of said light:

| Wavelength | TiN Thickness Range |
|---|---|
| 365 nm | 300–400 Å |
| 405 nm | 350–300 Å |
| 436 nm | 400–500 Å. |

6. A process for reducing the amount of light (18) having a preselected wavelength reflected back from a metal layer (12) comprising titanium to less than about 5% of the incident wavelength intensity into a resist layer (14) formed thereover comprising forming a layer (16) of titanium nitride between said metal layer and said resist layer, said layer of titanium nitride formed to a thickness having the following range associated with said wavelength of said light:

| Wavelength | TiN Thickness Range |
|---|---|
| 365 nm | 150–250 Å |
| 405 nm | 200–300 Å |
| 436 nm | 250–350 Å. |

7. A process of reducing reflection of incident optical radiation from a titanium layer (12) into an overlying layer (14) of photoresist to less than about 5%, said process comprising:
(a) forming said layer of titanium on a semiconductor wafer (10) having already formed therein integrated circuit elements;
(b) forming a layer (16) of titanium nitride on said titanium layer, the thickness of said titanium nitride layer (16) depending on the wavelength of said optical radiation (18) as follows:

| Wavelength | TiN Thickness Range |
|---|---|
| 365 nm | 150–250 Å |
| 405 nm | 200–300 Å |
| 436 nm | 250–350 Å; |

(c) forming said photoresist layer on said titanium nitride layer;
(d) exposing portions of said photoresist to a preselected wavelength of said optical radiation;
(e) removing said exposed portions to uncover underlying portions of said titanium nitride layer;
(f) removing said uncovered portions of said titanium nitride layer to uncover underlying portions of said titanium layer; and
(g) removing said uncovered portions of said titanium layer to form a patterned titanium layer.

8. The process of claim 7 wherein the remaining portions of said photoresist (14) and of said titanium nitride layer (16) are removed.

9. A process of reducing reflection of incident optical radiation (18) from an aluminum layer (12) into an overlying layer of photoresist (14) to less than about 2%, said process comprising:
(a) forming said layer of aluminum on a semiconductor wafer (10) having already formed therein integrated circuit elements;
(b) forming a layer (16) of titanium nitride on said aluminum layer, the thickness of said titanium nitride layer depending on the wavelength of said optical radiation as follows:

| Wavelength | TiN Thickness Range |
|---|---|
| 365 nm | 300–400 Å |
| 405 nm | 350–450 Å |
| 436 nm | 400–500 Å; |

(c) forming said layer of photoresist on said titanium nitride layer;
(d) exposing portions of said photoresist to a preselected wavelength of said optical radiation;
(e) removing said exposed portions to uncover underlying portions of said titanium nitride layer;
(f) removing said uncovered portions of said titanium nitride layer to uncover underying portions of said aluminum layer; and
(g) removing said uncovered portions of said aluminum layer to form a patterned aluminum layer.

10. The process of claim 9 wherein the remaining portions of said photoresist (14) are removed and the remaining portions of said titanium nitride layer (16) are left in place to suppress hillock formation.

* * * * *